United States Patent
Watts

(10) Patent No.: US 9,423,465 B1
(45) Date of Patent: Aug. 23, 2016

(54) STATE OF CHARGE DETERMINATION

(71) Applicant: Proterra Inc., Greenville, SC (US)

(72) Inventor: Ryan P. Watts, Simpsonville, SC (US)

(73) Assignee: Proterra Inc., Greenville, SC (US)

(*) Notice: Subject to any disclaimer, the term of this patent is extended or adjusted under 35 U.S.C. 154(b) by 32 days.

(21) Appl. No.: 14/755,891

(22) Filed: Jun. 30, 2015

(51) Int. Cl.
*H02J 7/00* (2006.01)
*G01R 31/36* (2006.01)
*B60L 11/18* (2006.01)
*H02J 7/04* (2006.01)

(52) U.S. Cl.
CPC ......... *G01R 31/3624* (2013.01); *B60L 11/1816* (2013.01); *B60L 11/1861* (2013.01); *H02J 7/007* (2013.01); *H02J 7/0068* (2013.01); *H02J 7/0078* (2013.01); *H02J 7/044* (2013.01)

(58) Field of Classification Search
CPC ....... H02J 7/0068; H02J 7/007; H02J 7/0078; H02J 7/044; B60L 11/1816; B60L 11/1861; G01R 31/3624
USPC .................................................. 320/132, 162
See application file for complete search history.

(56) References Cited

U.S. PATENT DOCUMENTS

| | | | |
|---|---|---|---|
| 8,453,773 B2 | 6/2013 | Hill et al. | |
| 8,749,204 B2* | 6/2014 | Majima | G01R 31/36 320/149 |
| 8,829,853 B2 | 9/2014 | Hill et al. | |
| 2011/0006737 A1* | 1/2011 | Saligram | H02J 7/0078 320/134 |
| 2011/0215761 A1* | 9/2011 | Mingant | G01R 31/3648 320/132 |
| 2013/0181682 A1* | 7/2013 | Yoshioka | H01G 11/14 320/134 |
| 2013/0193918 A1* | 8/2013 | Sarkar | B60L 3/04 320/109 |
| 2014/0070767 A1 | 3/2014 | Morris et al. | |
| 2014/0184233 A1* | 7/2014 | Nam | G01R 31/3679 324/426 |
| 2014/0191725 A1* | 7/2014 | Cordesses | H02J 7/0016 320/118 |
| 2015/0202985 A1* | 7/2015 | Le | B60L 11/1877 307/9.1 |

FOREIGN PATENT DOCUMENTS

WO    WO-2014078456    5/2014

OTHER PUBLICATIONS http://www.mpoweruk.com/soc.htm; "State of Charge (SOC) Determination"; dated Apr. 9, 2015; pp. 1-8.

Wang, H. et al.; "Study on State of Charge Estimation of Batteries for Electric Vehicle"; Harbin University of Science and Technology, School of Automation, China; ASP 2013, ASTL vol. 18, pp. 10-14, 2013.

* cited by examiner

*Primary Examiner* — Nathaniel Pelton
(74) *Attorney, Agent, or Firm* — Bookoff McAndrews, PLLC

(57) ABSTRACT

A method of determining the state of charge of a battery during charging may include providing a charging current having a first magnitude to the battery for charging, and changing a magnitude of the charging current from the first magnitude to a second magnitude. The second magnitude may be equal to the magnitude of current discharged from the battery during the charging. The method may also include determining a voltage across the battery after the changing, and determining a state of charge of the battery as a function of the determined voltage from a battery characterization curve.

17 Claims, 4 Drawing Sheets

STATE OF CHARGE DETERMINATION

TECHNICAL FIELD

The current disclosure relates to systems and methods of determining the state of charge of a battery. In particular, the current disclosure relates to systems and methods of determining the state of charge of a battery during a charging operation.

BACKGROUND

An electric vehicle (EV), also referred to as an electric drive vehicle, uses an electric motor (or traction motor) for propulsion. Electric vehicles may include all-electric vehicles where the electric motor is the sole source of traction power, and hybrid electric vehicles that include an auxiliary power source in addition to the electric motor. In an electric vehicle, energy may be stored in one or more batteries to power the electric motor. When the stored energy decreases, the batteries may be recharged by connecting the vehicle to a power supply. Knowing the amount of energy left in a battery compared with the energy it had when it was full (called State of Charge or SOC) gives the user an indication of how much longer a battery will continue to perform before it needs recharging. Using the analogy of a fuel tank in a car, the state of charge provides similar information as the gas/fuel gauge in a vehicle.

Several methods of estimating the state of charge of a battery have been used. Most of these methods depend on measuring some convenient parameter which varies with the SOC. A current based SOC estimation technique, called coulomb counting, determines the remaining capacity in a battery by accumulating the current entering (charging) and leaving (discharging) the battery cells over time. A voltage based SOC estimation technique uses the voltage of the battery cell as the basis for calculating SOC. Battery manufacturers typically characterize the relationship between the open circuit voltage of the battery and its state of charge. Based on this relationship, the SOC may be determined by measuring its open circuit voltage.

Measuring the open circuit voltage, however, requires the battery to not be in use (i.e., without net current input or output) for a certain time before its voltage is measured. Determining SOC while the battery is in use is usually done by coulomb counting. However, errors in current estimation during prolonged charging events may lead to errors in the determined SOC. Embodiments of the present disclosure may alleviate the problems discussed above and/or other problems in the art. The scope of the present disclosure, however, is defined by the attached claims, and not by the ability to solve any specific problem.

SUMMARY

Embodiments of the present disclosure relate to, among other things, systems and methods of determining state of charge for a battery. Each of the embodiments disclosed herein may include one or more of the features described in connection with any of the other disclosed embodiments.

In one embodiment, a method of determining the state of charge of a battery during charging is disclosed. The method may include providing a charging current having a first magnitude to the battery for charging, and changing a magnitude of the charging current from the first magnitude to a second magnitude. The second magnitude may be equal to the magnitude of current discharged from the battery during the charging. The method may also include determining a voltage across the battery after the changing, and determining a state of charge of the battery as a function of the determined voltage from a battery characterization curve.

In another embodiment, a method of determining the state of charge of a battery during charging is disclosed. The method may include determining a magnitude of current discharged from the battery during a charging event, and providing the battery with current having a magnitude substantially equal to the determined magnitude of current. The method may also include determining a voltage across the battery during the providing, and determining a state of charge of the battery corresponding to the determined voltage from a battery characterization curve.

In yet another embodiment, a charging system for a battery is disclosed. The charging system may include one or more batteries, and a charging interface configured to electrically connect the one or more batteries to a power supply for charging. The charging system may also include a control system configured to provide a charging current having a first magnitude to the one or more batteries for charging, and change a magnitude of the charging current from the first magnitude to a second magnitude. The second magnitude may be the magnitude of current discharged from the one or more batteries during the charging. The control system may also be configured to determine a state of charge of the one or more batteries while being provided with charging current having the second magnitude.

BRIEF DESCRIPTION OF THE DRAWINGS

The accompanying drawings, which are incorporated in and constitute a part of this specification, illustrate exemplary embodiments of the present disclosure and together with the description, serve to explain the principles of the disclosure.

DETAILED DESCRIPTION

The present disclosure describes systems and methods for determining the state of charge for a battery. While principles of the current disclosure are described with reference to the estimation of SOC of the batteries of an electric bus, it should be understood that the disclosure is not limited thereto. Rather, the systems and methods of the present disclosure may be used to estimate the SOC of the battery of any device (cell phones, home appliances, electric vehicles (cars, two-wheelers, trains, etc.), etc.).

Figure 1:
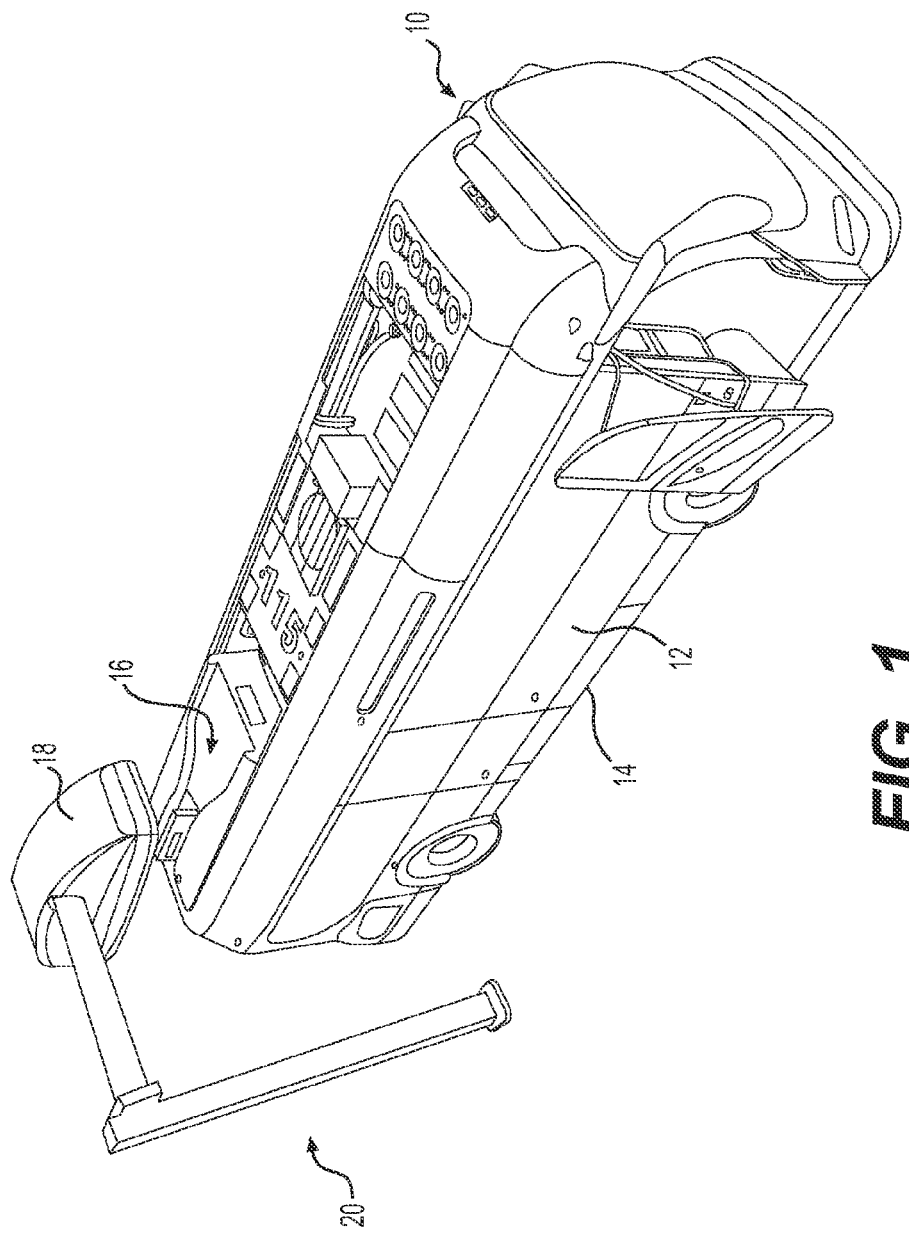
FIG. 1 is an exemplary electric bus having batteries.

FIG. 1 illustrates a low-floor electric bus 10. Electric bus 10 may include a body 12 and a floor enclosing a space for passengers. In some embodiments, the body 12 and the floor may be integrated as a single part. The integrated body and floor may form an outer shell, and inner layers (e.g., inner floor, side walls, etc.) may then be attached within the outer shell to define an interior space for the passengers. In some embodiments, some (or substantially all) parts of body 12 and the floor may be fabricated using composite materials to reduce the weight of bus 10. Body 12 of bus 10 may have any size, shape, and configuration. An electric motor powered by batteries 14 may propel the bus 10.

The batteries 14 may have any structure and chemistry. In some embodiments, the batteries may be lithium titanate oxide (LTO) batteries. In some embodiments, the batteries 14 may be nickel manganese cobalt (NMC) batteries. The LTO batteries may be fast charge batteries that may allow the bus 10 be recharged to substantially its full capacity in a small amount of time (e.g., about ten minutes or less). In this disclosure, the term "about" is used to indicate a potential variation of 10% of a stated value. Due to its higher charge density, NMC batteries may take longer to charge to a comparable SOC than an LTO battery, but NMC batteries may retain a larger amount of charge and thus increase the range of the bus 10 between charging events. It is also contemplated that, in some embodiments, the batteries 14 may include other or multiple different chemistries. For instance, some of the batteries 14 may be LTO or NMC batteries, while other batteries may have another chemistry (for example, lead-acid, nickel cadmium, nickel metal hydride, lithium ion, zinc air, etc.).

In some embodiments, batteries 14 may be configured as a plurality of strings of battery packs connected in parallel. Each battery pack may include a plurality of battery modules connected in series enclosed in an enclosure. And, each battery module may include a plurality of battery cells connected in series. In some embodiments, batteries 14 of bus 10 may include one or more battery strings connected in parallel, with each string comprising 2-10 battery packs connected in series. In some embodiments, each battery pack may include 80-200 battery cells connected in series. Configuring the batteries 14 as parallel connected strings allows the bus 10 to continue operating with one or more strings disconnected if a battery pack (or a battery cell) in a string fails or experiences a problem. The batteries 14 may be positioned anywhere on the bus 10. In some embodiments, some or all of the batteries 14 (e.g., battery packs) may be positioned under the floor of the bus 10 (e.g., in cavities formed under the floor). Some possible battery chemistries and configurations are described in commonly assigned U.S. Pat. No. 8,453,773 which is incorporated herein by reference in its entirety. In this disclosure, the term battery is used broadly to refer to any configuration of battery (e.g., a battery with a single battery cell, a battery assembly having a plurality of battery packs, battery modules, and battery cells, etc.).

Bus 10 may include a charging interface 16. The charging interface 16 may be configured to interface with a power source to charge the batteries 14. The power source may include an external power source (e.g., a power supply grid) or an internal power supply (e.g., an IC engine, fuel cell, etc.). Without limitation, the bus 10 may include any type of charging interface 16 that is adapted to engage with the power supply (e.g., plug, connector, etc.). In some embodiments, the charging interface 16 may be provided on the roof, or another external surface, of the bus 10 to engage with an external power supply. In some embodiments, the charging interface 16 may engage with the charging head 18 of a charging station 20 to provide external power to the batteries 14. It is also contemplated that bus 10 may be charged by other methods. For example, in some embodiments, the batteries 14 of the bus 10 may be connected (e.g., using a wire, etc.) to a shop charger or a wall charger to charge the bus 10 using external power during a long layover (night, etc.). Some possible embodiments of charging interfaces and charging stations 30 are described in commonly-assigned patents/applications: U.S. Pat. No. 8,829,853; U.S. Patent Application Publication No. 2014/0070767, and International Application Publication Nos. WO/2014/078456 each of which are incorporated by reference in their entirety herein.

The charging station 20 may be provided at any location (bus depot, road side, etc.) and may be powered by an electric utility grid. In some embodiments, bus 10 may be a transit bus that operates along a fixed route (airport, university campus, city, town, county, etc.) in a geographic area. That is, bus 10 may operate along its fixed route picking up and dropping off passengers at several bus stops along the route. In some such embodiments, the charging stations 20 may be provided in some of these bus stops so that a bus 10 may be recharged while passengers are loaded or unloaded. In some embodiments, bus 10 may be a long-haul bus that travels between two remote locations (towns, cities, etc.). In some such embodiments, charging stations 20 may be provided at one or both the origination and destination locations to charge the bus at the beginning and end of its route. In some embodiments, bus 10 may also include an on-board charging device (such as, an internal combustion engine, fuel cell, etc.) to charge the batteries 14, for example, when the bus is not close to a charging station 20.

During operation of the bus 10, the batteries 14 provide power to the electric motor for propulsion (propulsion power $I_P$) and power to operate auxiliary components (auxiliary power $I_A$) such as HVAC, pneumatic compressors, etc. of the bus 10. Providing propulsion and auxiliary power decreases the state of charge (SOC) of the batteries 14 in the bus 10. The SOC is the ratio of the amount of energy stored in the batteries 14 compared to the total amount of energy that the batteries 14 are capable of carrying. That is, a battery having a 100 KWh (Kilo Watt hours) energy capacity has 50% SOC when it has 50 KWh of stored charge. The bus 10 may be recharged at a charging station 20 (or using a shop charger, plug-in charger etc.) when its SOC decreases below a desired value. In general, the batteries 14 may be recharged by any amount during charging. In some embodiments, the batteries 14 may be recharged to about 90-100% SOC during charging. To determine when to recharge the batteries 14, and how long to recharge, a control system 30 may determine the state of charge of the batteries 14 both when the bus is in operation and when the bus is being charged. In this disclosure, the term operation is used to refer to the time period when the bus is not being charged (i.e., driving, stopped without undergoing charging, etc.).

Figure 2:
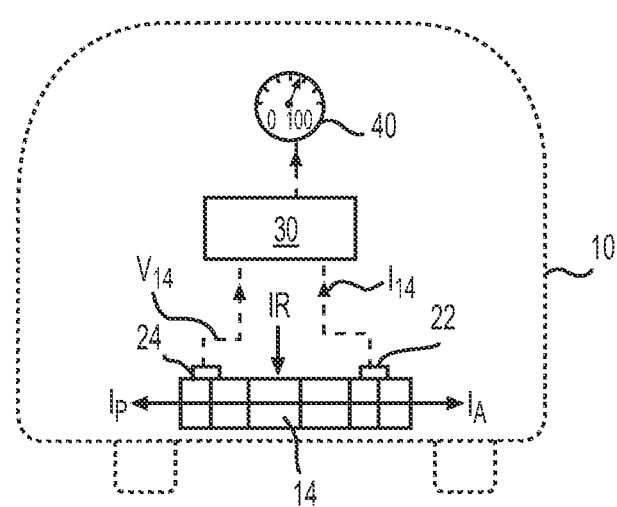
FIG. 2 is a schematic illustration of an exemplary control system used to determine the state of charge of the batteries of FIG. 1 during operation.

FIG. 2 illustrates an exemplary embodiment of a control system 30 that determines the SOC of the batteries 14. Control system 30 may be part of a device that controls several functions (for example, HVAC, door opening/closing, kneeling, etc.) of the bus 10. As is known in the art, control system 30 may include a collection of mechanical, electrical, and electronic devices (for example, computational units, A/D converters, memory, switches, valves, actuators, fuses, etc.) that collectively perform the functions of control system 30. Although control system 30 is illustrated as a single system in bus 10, in some embodiments, the functions of control system 30 may be divided across multiple controllers in the bus 10 and the charging station 20.

The control system 30 may determine the SOC of the batteries 14 by coulomb counting (i.e., by counting the energy entering and leaving the batteries 14). The energy contained in an electric charge is measured in Coulombs, which is the quantity of electricity conveyed in one second by a current of one ampere. As will be explained later, after a charging event, the control system 30 knows the amount of charge stored in the batteries 14. When the bus 10 is in motion, regenerative braking may produce energy to charge the batteries 14, and the batteries 14 provide energy to power the motor and the auxiliary components. The energy produced by regenerative braking may be directed into the batteries 14 as current $I_R$. Energy may be discharged from the batteries 14 as current $I_P$ (for propulsion) and current $I_A$ (to power auxiliary components). By coulomb counting, the control system 30 may determine the SOC of the batteries 14 during operation, by summing the total current entering ($I_R$) and leaving ($I_P+I_A$) the batteries 14 with the energy stored in the batteries 14 after the last charging event, and dividing this value by the known energy capacity of the batteries 14 (e.g., based on manufacturers specifications, etc.).

One or more current sensors 22 associated with the batteries 14 may indicate to the control system 30 the magnitude of the total current $I_{14}$ entering or leaving the batteries 14 at any time (i.e., $I_{14}=I_P+I_A-I_R$). During operation of the bus 10, the control system 30 may integrate this current $I_{14}$ over time to determine the total current entering or leaving the batteries 14. The control system 30 may display the determined SOC to the driver of the bus 10 in an SOC indicator gauge 40 or another display mechanism. In some embodiments, errors in measurement of current $I_{14}$ (and/or other errors) may accumulate over time (e.g., in the integral) and cause errors in the determined SOC. In some embodiments, the control system 30 may correct the SOC determined by coulomb counting using the SOC determined by another method (e.g., based on the open voltage of the batteries 14).

The open voltage ($V_{OC}$) of the batteries 14 is the difference in electrical potential (or voltage) between the terminals of the batteries 14 when it is disconnected from any circuit. The open voltage is equivalent to the voltage of the batteries 14 when no electric current flows between its terminals (i.e., $I_{14}$ is zero). A predetermined time (3 min, 5 min, etc.) after the bus 10 is stopped (e.g., in between routes, etc.) and its batteries 14 are idle (i.e., $I_P=I_R=0$, $I_A\approx 0$, and $I_{14}$ indicated by sensor 22 is substantially zero or negligible), control system 30 may measure the voltage $V_{14}$ of the batteries 14 using a voltage sensor 24 associated with the batteries 14. This measured voltage $V_{14}$ may be equivalent to the open voltage $V_{OC}$ of the batteries 14 since substantially no electric current flows between the battery terminals (i.e., $V_{14}\approx V_{OC}$, when $I_{14}\to 0$). The predetermined time after which voltage $V_{14}$ is measured may depend on the chemistry of the batteries and the application. This time value may be preprogrammed in the control system 30. For example, if batteries 14 are LTO batteries, in some embodiments, voltage $V_{14}$ may be measured after about 3-10 minutes after the bus 10 is stopped, and if the batteries are NMC batteries, voltage $V_{14}$ may be measured after about 5-15 minutes after the bus 10 is stopped. The control system 30 may then determine the SOC of the batteries 14 from battery characterization curves that plot the SOC of the batteries 14 as a function of its open voltage. These characterization curves may be provided by the battery manufacturer or may be generated by experimentation.

Figure 3:
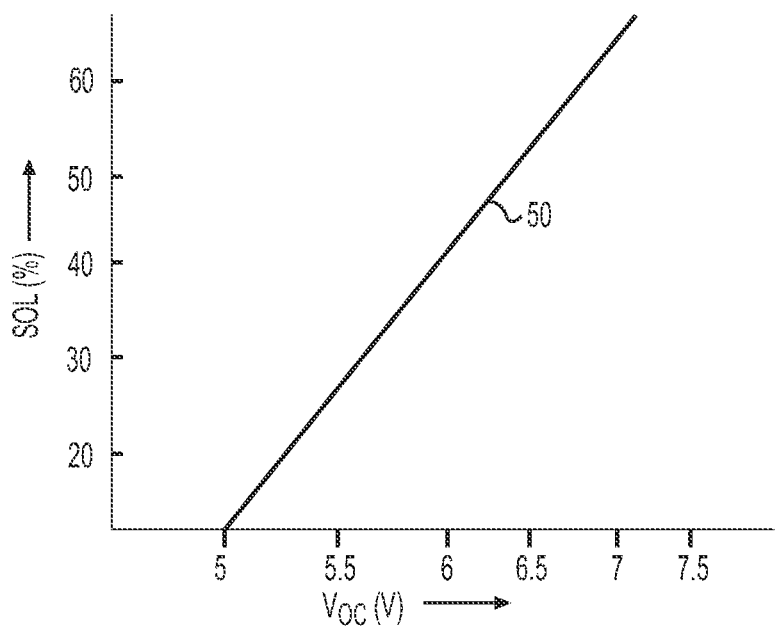
FIG. 3 is an exemplary battery characterization curve of the batteries of FIG. 1.

FIG. 3 illustrates an exemplary battery characterization curve 50 of batteries 14. Curve 50 plots the variation of SOC with $V_{OC}$ of the batteries 14. In some embodiments, curve 50 may include a plurality of curves (e.g., at different temperatures, etc.). Data corresponding to curve 50 may be preprogrammed into the control system 30, and this data may be used by the control system 30 to determine the SOC of the batteries 14 corresponding to the measured voltage $V_{14}$. Although curve 50 is indicated as a linear curve, this is not a requirement. In general, curve 50 may have any shape. For example, in some embodiments, curve 50 may be non-linear, piecewise linear, or curved.

Control system 30 may use the SOC determined from the characterization curve 50 to correct the SOC determined by coulomb counting. In some embodiments, correcting the SOC may include replacing the SOC determined using coulomb counting using the SOC determined using curve 50. In some embodiments, the control system 30 may periodically (e.g., when the bus 10 stops at a bus stop, in between routes, etc.) determine the SOC based on curve 50 and use this value to correct the SOC determined by coulomb counting. When the determined SOC of the bus 10 is below a desired value, the bus 10 may dock with a charging station 20 (or at another suitable charger) for charging. When the bus is positioned below the charging station 20, the overhanging charging head 18 of the charging station 20 may descend (in some embodiments, swing over and descend) and engage with the charging interface 16 on the roof of the bus 10 to charge the batteries 14. As discussed previously, the batteries 14 may also be charged by other methods (e.g., by an internal fuel cell, by electrically connecting the batteries 14 to a shop power supply, etc.).

Figure 4:
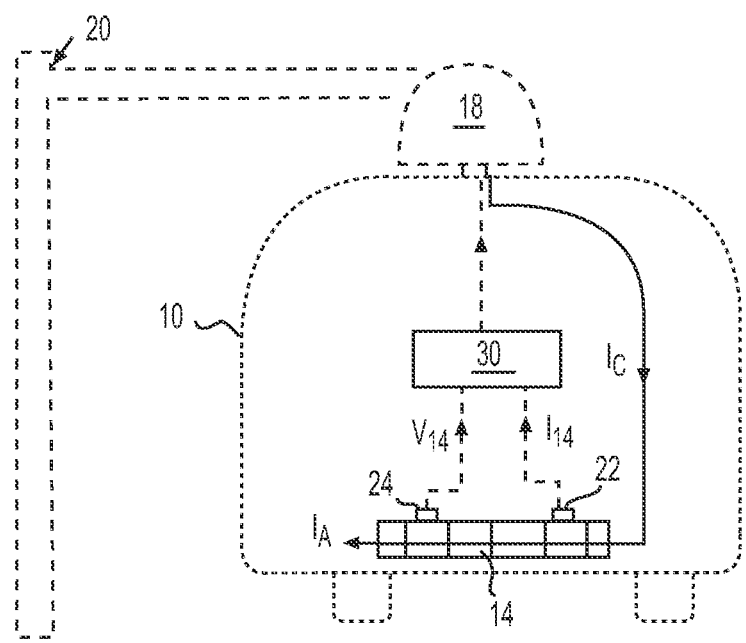
FIG. 4 is a schematic illustration of an exemplary control system used to determine the state of charge of the batteries of FIG. 1 during charging.

The batteries 14 may be charged to any desired SOC (e.g., 80%, 90%, 100% etc.) at the charging station 20. FIG. 4 illustrates the control system 30 determining the SOC during charging. After the charging interface 16 engages with the charging head 18, charging current $I_C$ may be provided to the batteries 14 for charging through the charging head 18. In some embodiments, the control system 30 may control the magnitude of the charging current $I_C$ directed to the batteries 14 from the charging station 20. In some embodiments, a controller of the charging station 20 may work with the control system 30 to control the magnitude of charging current $I_C$. In some embodiments, the flow of charging current $I_C$ to the batteries 14 may only be activated after the control system 30 (or another controller) receives a pilot signal from the charging interface 16 that confirms that good electrical contact has been made between the charging interface 16 and the charging head 18. The flow of charging current $I_C$ into the batteries 14 may be stopped after the batteries 14 are charged to the desired SOC. After charging, the bus 10 may be disengaged from the charging station 20 and driven away.

To indicate when to stop charging the batteries 14, the control system 30 may determine the SOC of the batteries 14 during the charging process. As discussed with reference to FIG. 2, the current sensor 22 and the voltage sensor 24 indicate the total current $I_{14}$ entering/leaving the batteries 14 and the battery voltage $V_{14}$, respectively, to the control system 30. Since the bus 10 is stopped during the charging process, the batteries 14 do not use power to run the motor (i.e., $I_P=0$), and do not receive power from regenerative braking (i.e., $I_R=0$). However, in some applications, some auxiliary components (such as the HVAC system, hydraulic components to operate the doors, etc.) of the bus 10 may be operational and consume power (i.e., $I_A\neq 0$) during the charging process. Therefore, the magnitude of the current $I_{14}$ indicated by the current sensor 22 may be equal to $I_C-I_A$. For example, if the charging current $I_C$ is about 100 Amps and the current $I_A$ discharged from the batteries 14 to power the auxiliary components is about 20 Amps, the current $I_{14}$ indicated by current sensor 22 will be about 80 Amps.

In some embodiments, similar to when the bus 10 in operation, the control system 30 may determine the SOC during charging by coulomb counting. As discussed previously, errors accumulated over time may cause the SOC determined by this method to vary significantly from the actual SOC of the batteries 14 after some time. However, since current $I_{14}$ is not substantially zero or negligible during charging, the voltage $V_{14}$ measured by the voltage sensor 24 may not be equivalent to the open circuit voltage ($V_{OC}$) of the batteries 14. That is, during charging, the error in the determined SOC may not be correctable using the SOC determined from the characterization curve 50 of FIG. 3 (as such error is corrected during operation).

In some embodiments, after a predetermined time (15 minutes, 30 minutes, etc.) of charging, the control system 30 may instruct the charging station 20 to vary the charging current $I_C$ until the current $I_{14}$ measured by current sensor 22 is substantially zero. Recall that $I_{14}=I_C-I_A$ at this time. That is, the control system 30 may adjust the charging current $I_C$ to be substantially equal to the amount of current that is being discharged from the batteries at that time (e.g., to power the auxiliary components, i.e., $I_A$). In other words, after a predetermined time of charging, the control system 30 may instruct the charging station 20 to make $I_C \approx I_A$. For example, if the charging current $I_C$ is 100 Amps and $I_A$ is 20 Amps (and $I_{14}$ detected by sensor $22=I_C-I_A=80$ Amps), after a predetermined time of charging, the control system 30 may adjust the charging current (or instruct the charging station 20 to change $I_C$) until $I_{14} \approx 0$ (i.e., make $I_C \approx 20$ Amps). The predetermined time after which the charging current is changed may be any value preprogrammed into the control system 30. In some embodiments, this time may depend upon the total charging time and other battery related factors (design, chemistry, etc.). For example, in an exemplary application where the total charging time is about 2 hours, this predetermined time may vary from about 15 minutes to 45 minutes. In some embodiments, this predetermined time may correspond to the time after which the error accumulated is the SOC determined by coulomb counting exceeds a desired value.

Although the current required to power the auxiliary components ($I_A$) is described as being discharged from the batteries 14, during charging, battery impedance increases the resistance of current flow from the batteries 14. Therefore, the portion of the current needed to power the auxiliary components (i.e., $I_A$) is diverted from the current provided to the batteries 14 for charging ($I_C$), and the remaining current ($I_C-I_A$) is directed into the batteries 14. That is, in the previous example where $I_C=100$ Amps and $I_A=20$ Amps, the 20 Amps required to power the auxiliary components is diverted directly from $I_C$ and only the remainder (i.e., 80 Amps) is directed into the batteries 14. Therefore, when the control system 30 changes the charging current $I_C$ to be substantially equal to the current needed to power the auxiliary components $I_A$, current $I_C$ is supplied directly to the auxiliary components, and the total current ($I_{14}$) entering the batteries 14 will be substantially zero. When the total current $I_{14}$ entering the batteries 14 is substantially zero or negligible, the voltage $V_{14}$ measured by the voltage sensor 24 is equivalent to the open circuit voltage $V_{OC}$. After the batteries 14 are provided with a charging current of $I_A$ for a predetermined time (3 min, 5 min, etc.), the control system 30 may determine the SOC using the battery characterization curve 50 of FIG. 3.

It should be noted that although the state of charge of the batteries 14 are described as being determined using the battery characterization curve 50, this is not a requirement. It is also contemplated that other methods (e.g., direct measurement, based on specific gravity measurements, etc.) may be used to determine the SOC of the batteries 14 when the charging current $I_C$ is substantially equal to the current discharged from the batteries $I_A$. Since these methods are known in the art, they are not discussed herein. In some embodiments, the determined SOC may be used to correct the SOC determined using coulomb counting. In some embodiments, correcting the SOC may include replacing the value obtained using coulomb counting with the value obtained using the characterization curve 50. After the SOC is determined, the control system 30 may change the charging current $I_C$ back to its original value or to a different value greater than $I_A$.

Figure 5:
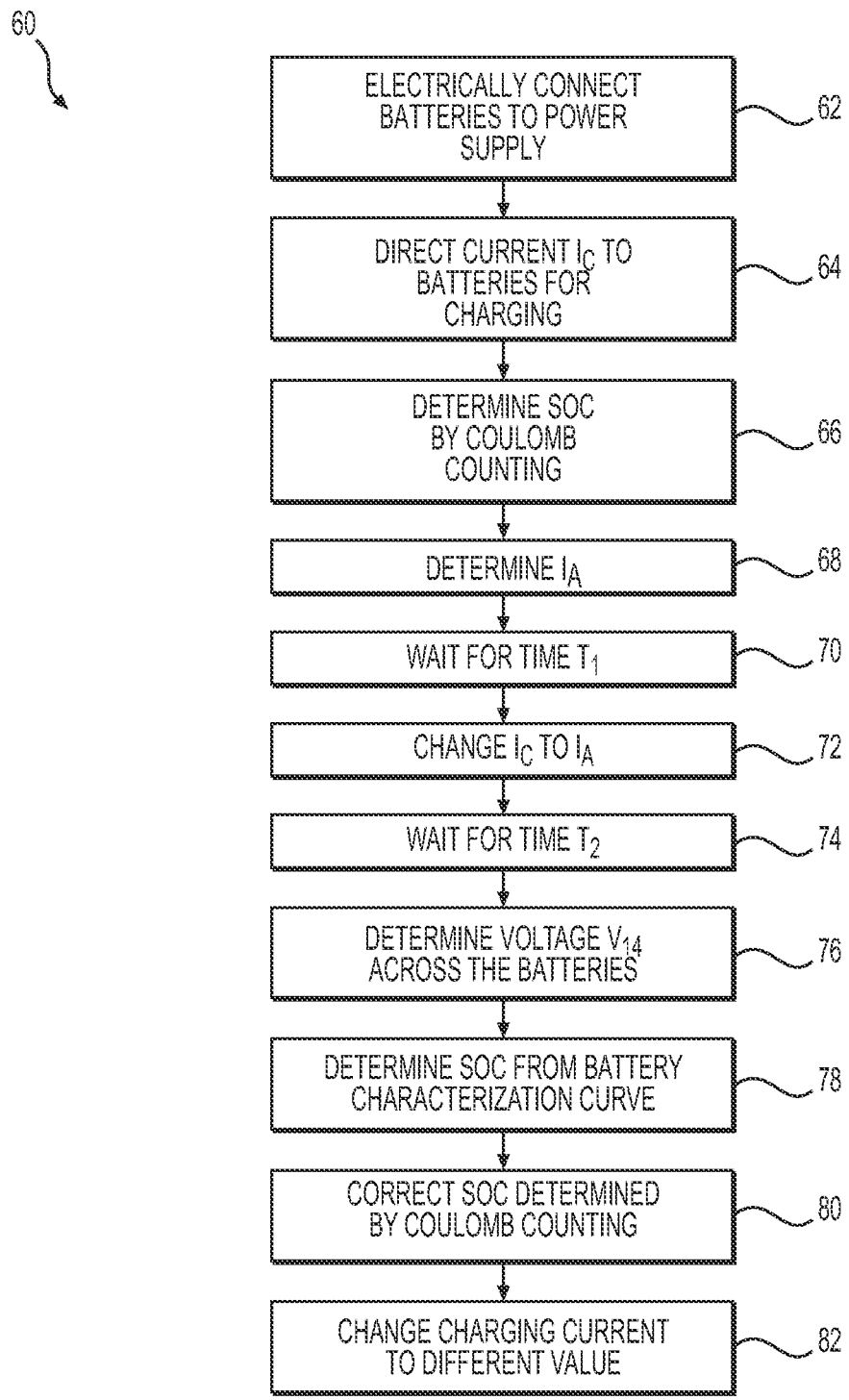
FIG. 5 is a flow chart of an exemplary method used to determine the state of charge of the batteries of FIG. 1 during charging.

FIG. 5 illustrates an exemplary method 60 of determining the SOC of batteries 14 during a charging event. When the SOC of the batteries 14 is below a threshold value, the batteries 14 are electrically connected to a power supply (step 62) to direct charging current Ic to the batteries 14 (step 64). The power supply may be an external power source (e.g., an electric utility grid, generator, etc.) or an internal power source (IC engine, fuel cell, etc.). The batteries 14 may be electrically connected to the power supply by any method (e.g., wires, docking with a charger, etc.). In some embodiments, the SOC of the batteries 14 during charging may be determined by coulomb counting (step 66). The current $I_A$ discharged from the batteries 14 during charging is determined (step 68) (e.g., using current sensor 22). In general, current $I_A$ may correspond to the current discharged from the batteries 14 to power auxiliary components (HVAC etc. of an electric vehicle, or clocks, displays, etc. of another electronic device) during the charging event. After charging the batteries 14 using current $I_C$ for a first predetermined time $T_1$ (step 70), the charging current $I_C$ is changed to be substantially equal to the current $I_A$ used to power the auxiliary components (step 72). After directing current $I_A$ to the batteries 14 for a second predetermined time $T_2$ (step 74), the voltage $V_{14}$ across the batteries 14 is noted (step 76). In general, the first predetermined time $T_1$ and the second predetermined time $T_2$ may be any values of time. The SOC corresponding to the noted voltage $V_{14}$ may then be determined using the battery characterization curve 50 of FIG. 3 (step 78). In some embodiments, the SOC determined in step 78 may be used to correct the SOC determined by coulomb counting (step 80). In some embodiments, correcting the SOC may include replacing the SOC determined in step 66 (by coulomb counting) with SOC determined in step 78. The charging current $I_C$ may then be changed to a different value (step 82) greater than $I_A$. This different value may be the same as the value of $I_C$ in step 64 or another value.

Using embodiments of the disclosed system and method, the SOC of the batteries 14 may be accurately determined both during operation and charging. During both operation and charging, the SOC of the batteries 14 is typically determined by coulomb counting. Since the coulomb counting process naturally involves errors that accumulate over time, after a prolonged time of operation or charging, the SOC determined by coulomb counting may become inaccurate. Therefore, the SOC determined by coulomb counting is corrected periodically using the SOC determined using the battery characterization curve. However, determining the SOC using the battery characterization curve requires the batteries to be substantially idle (i.e., substantially no current is input into, or output from, the batteries) during the determination process.

During operation of the bus 10, there are time periods when the batteries 14 are substantially idle (e.g., when the bus 10 is between routes, etc.). During these time periods, the SOC of the batteries 14 may be obtained using the battery characterization curve. However, during charging of the bus 10, the batteries 14 are typically never substantially idle. During charging, charging current $I_C$ is input into the batteries 14 and auxiliary current $I_A$ is discharged from the batteries 14. Therefore, periodically, the charging current $I_C$ is forced to be substantially equal to the auxiliary current $I_A$ for a brief period of time, to make the batteries substantially idle. The SOC of the batteries obtained using the battery characterization curve in this brief time period may be used to correct the SOC obtained by coulomb counting.

While principles of the present disclosure are described with reference to determining the SOC of the batteries of an electric buses, it should be understood that the disclosure is not limited thereto. Rather, the systems and methods described herein may be employed to determine the SOC of any battery (battery of an cell phone, etc.). Those having ordinary skill in the art and access to the teachings provided herein will recognize additional modifications, applications, embodiments, and substitution of equivalents all fall within the scope of the embodiments described herein. Accordingly, the invention is not to be considered as limited by the foregoing description. For example, while certain features have been described in connection with various embodiments, it is to be understood that any feature described in conjunction with any embodiment disclosed herein may be used with any other embodiment disclosed herein.

I claim:

1. A method of determining the state of charge of a battery of an electric vehicle during charging at a charging station, comprising:
   providing a charging current having a first magnitude from the charging station to the battery of the electric vehicle;
   decreasing a magnitude of the charging current from the first magnitude to a second magnitude after a first predetermined time, wherein the first predetermined time is a value preprogrammed into a control system that controls the charging, and wherein the second magnitude is the magnitude of current discharged from the battery during the charging;
   determining a voltage across the battery while providing the second magnitude of current to the battery;
   determining a state of charge of the battery as a function of the determined voltage from a battery characterization curve; and
   increasing the magnitude of the charging current from the second magnitude to a third magnitude after determining the state of charge.

2. The method of claim 1, further including determining a state of charge of the battery by coulomb counting before changing the magnitude of the current, and correcting the state of charge determined by coulomb counting using the state of charge determined from the battery characterization curve.

3. The method of claim 1, wherein determining the voltage includes determining the voltage after the second magnitude of current is provided to the battery for a second predetermined time.

4. The method of claim 3, wherein the second predetermined time is a value of time preprogrammed into the control system.

5. The method of claim 1, wherein the first predetermined time depends on a total charging time of the electric vehicle.

6. The method of claim 5, wherein the electric vehicle is a bus and electrically connecting the battery to the charging station includes connecting a charging interface on a roof of the bus to an overhanging charge head of the charging station.

7. The method of claim 1, wherein changing a magnitude of the charging current includes periodically changing the magnitude of the current from the first magnitude to the second magnitude during the charging.

8. A method of determining the state of charge of a battery of an electric vehicle during charging, comprising:
   providing a charging current to the battery during a charging event, the charging current having a first magnitude;
   determining a magnitude of current discharged from the battery during the charging event;
   periodically decreasing the magnitude of the charging current from the first magnitude to a second magnitude after a predetermined period of time, the predetermined period of time being a value preprogrammed into a control system that controls the charging event, wherein the second magnitude is substantially equal to the determined magnitude of current;
   determining a voltage across the battery while providing the second magnitude of current to the battery;
   determining a state of charge of the battery corresponding to the determined voltage from a battery characterization curve; and
   changing the magnitude of current provided to the battery to a higher value after determining the state of charge.

9. The method of claim 8, wherein providing charging current to the battery includes providing the charging current from an external power supply.

10. The method of claim 8, wherein determining the voltage includes determining the voltage after providing the battery with current having the second magnitude for a predetermined time.

11. The method of claim 8, wherein the battery is a battery of an electric bus.

12. The method of claim 11, wherein the battery includes one of lithium titanate oxide or nickel manganese cobalt.

13. A charging system for a battery, comprising:
   one or more batteries;
   a charging interface configured to electrically connect the one or more batteries to a power supply for charging; and
   a control system configured to:
     provide a charging current having a first magnitude to the one or more batteries for charging;
     decrease a magnitude of the charging current from the first magnitude to a second magnitude after a first predetermined time, wherein the first predetermined time is a value preprogrammed into the control system, and wherein the second magnitude is the magnitude of current discharged from the one or more batteries during the charging;
     determine a state of charge of the one or more batteries while being provided with charging current having the second magnitude; and
     change the magnitude of the charging current from the second magnitude to a third magnitude after determining the state of charge, wherein the third magnitude is greater than the second magnitude.

14. The system of claim 13, wherein determining the state of charge includes determining a voltage across the one or more batteries, and determining a state of charge of the battery corresponding to the determined voltage from a battery characterization curve.

15. The system of claim 13, wherein the one or more batteries are included in an electric vehicle and the power supply is an external power supply.

16. The system of claim 15, wherein the electric vehicle is an electric bus and the one or more batteries include one of lithium titanate oxide or nickel manganese cobalt.

17. The system of claim 13, wherein the control system is configured to provide the one or more batteries with charging current having the second magnitude for a second predetermined time before determining the state of charge.

* * * * *